United States Patent
Li et al.

(10) Patent No.: US 11,782,191 B2
(45) Date of Patent: Oct. 10, 2023

(54) SYSTEMS AND FABRICATION METHODS FOR DISPLAY PANELS WITH INTEGRATED MICRO-LENS ARRAY

(71) Applicant: Jade Bird Display (Shanghai) Limited, Shanghai (CN)

(72) Inventors: Qiming Li, Albuquerque, NM (US); Yuankun Zhu, Shanghai (CN); Shuang Zhao, Shanghai (CN)

(73) Assignee: Jade Bird Display (Shanghai) Limited, Shanghai (CN)

( * ) Notice: Subject to any disclaimer, the term of this patent is extended or adjusted under 35 U.S.C. 154(b) by 38 days.

(21) Appl. No.: 17/038,503

(22) Filed: Sep. 30, 2020

(65) Prior Publication Data

US 2021/0096283 A1    Apr. 1, 2021

Related U.S. Application Data

(60) Provisional application No. 62/909,205, filed on Oct. 1, 2019.

(51) Int. Cl.
*G02B 3/00* (2006.01)
*H01L 33/58* (2010.01)
(Continued)

(52) U.S. Cl.
CPC ......... *G02B 3/0056* (2013.01); *G02B 3/0012* (2013.01); *G06F 1/1609* (2013.01); *H01L 33/0095* (2013.01); *H01L 33/58* (2013.01)

(58) Field of Classification Search
CPC ..... G02B 3/0056; G02B 3/0012; H01L 33/58; H01L 33/56; G06F 1/1609
See application file for complete search history.

(56) References Cited

U.S. PATENT DOCUMENTS

| | | | |
|---|---|---|---|
| 6,699,729 B1 | 3/2004 | Yamamoto | |
| 2006/0073623 A1* | 4/2006 | Conley, Jr. | ........ H01L 21/31133 257/E21.255 |

(Continued)

FOREIGN PATENT DOCUMENTS

| | | | | |
|---|---|---|---|---|
| CN | 109256455 | * | 1/2019 | ............. H01L 33/58 |
| JP | 2005159773 A | * | 6/2005 | ............. B41J 2/451 |
| KR | 20170027267 A | | 3/2017 | |

OTHER PUBLICATIONS

The International Searching Authority, the International Search Report and the Written Opinion, PCT/US2020/053404, Hong Kong Beida Jade Bird Display Limited, dated Jan. 14, 2021, 9 pages.

*Primary Examiner* — Alicia M Harrington
(74) *Attorney, Agent, or Firm* — Morgan, Lewis & Bockius LLP

(57) ABSTRACT

Various embodiments include a display panel with an integrated micro-lens array. The display panel typically includes an array of mesas which includes an array of pixel light sources (e.g., LEDs) electrically coupled to corresponding pixel driver circuits (e.g., FETs). The array of micro-lenses is aligned to the mesas including the pixel light sources, and positioned to reduce the divergence of light produced by the pixel light sources. In some embodiments, the array of micro-lenses formed from a micro-lens material layer is formed directly on top of the mesas. The display panel may also include an integrated optical spacer formed from the same micro-lens material layer to maintain the positioning between the micro-lenses and pixel driver circuits.

16 Claims, 8 Drawing Sheets

(51) Int. Cl.
*H01L 33/00* (2010.01)
*G06F 1/16* (2006.01)

(56) References Cited

U.S. PATENT DOCUMENTS

| | | | |
|---|---|---|---|
| 2009/0020924 A1* | 1/2009 | Lin | B81C 1/00031 |
| | | | 425/375 |
| 2009/0146237 A1 | 6/2009 | Yun | |
| 2010/0149450 A1* | 6/2010 | Okumura | G02B 3/0018 |
| | | | 359/628 |
| 2014/0339495 A1* | 11/2014 | Bibl | H01L 25/0753 |
| | | | 257/13 |
| 2016/0097883 A1 | 4/2016 | Wakabayashi | |
| 2016/0133762 A1* | 5/2016 | Blasco Claret | H01L 27/14625 |
| | | | 257/432 |
| 2017/0062770 A1* | 3/2017 | Jang | H01L 51/5293 |
| 2017/0069611 A1* | 3/2017 | Zhang | H01L 25/167 |
| 2017/0155094 A1 | 6/2017 | Joung et al. | |
| 2019/0259643 A1 | 8/2019 | Saketi et al. | |

* cited by examiner

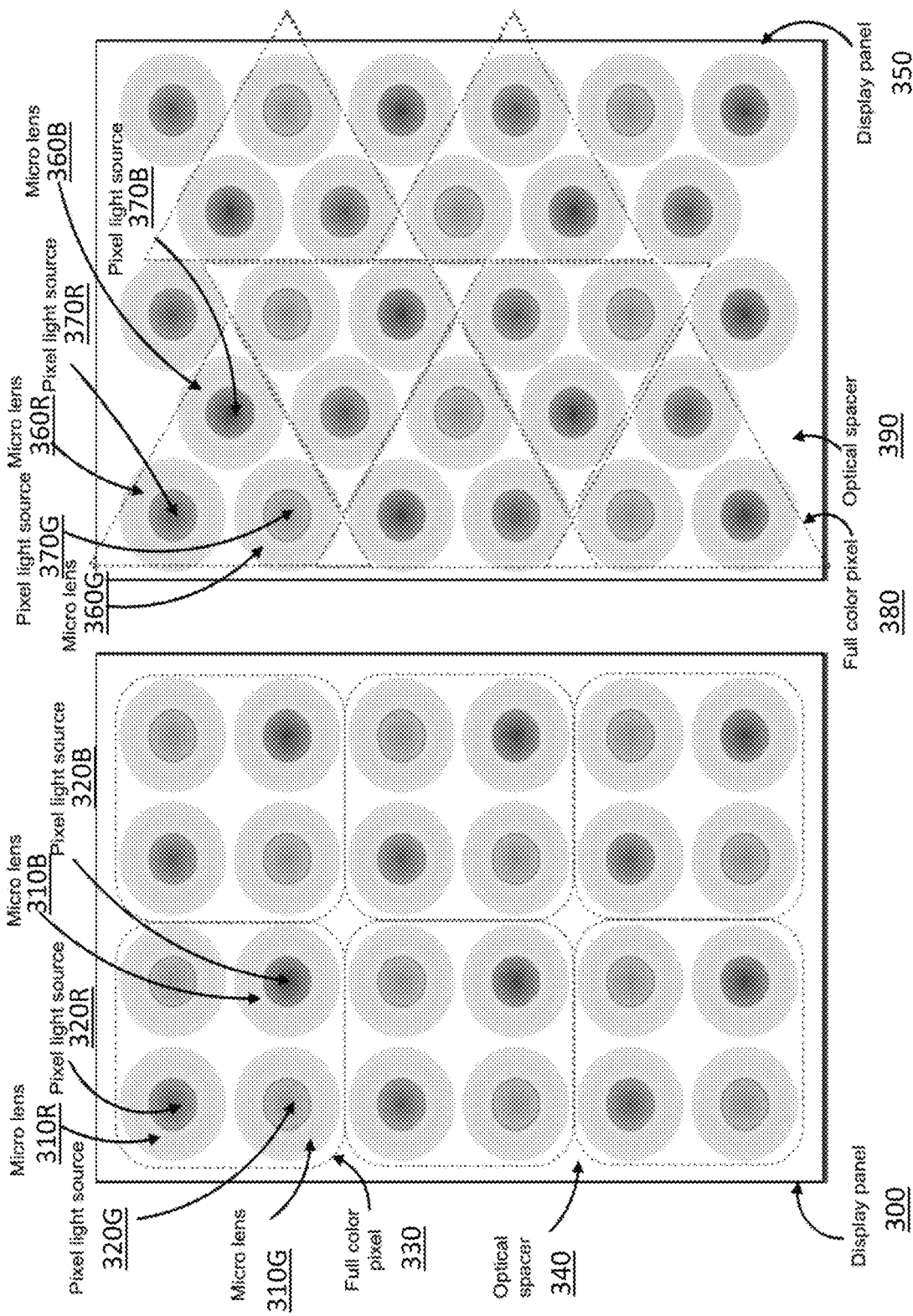

SYSTEMS AND FABRICATION METHODS FOR DISPLAY PANELS WITH INTEGRATED MICRO-LENS ARRAY

RELATED APPLICATIONS

This application claims priority to U.S. Provisional Patent Application No. 62/909,205, filed Oct. 1, 2019, entitled "Systems and Fabrication Methods for Display Panels with Integrated Micro-Lens Array," which is hereby incorporated by reference.

TECHNICAL FIELD

The present disclosure relates generally to display devices, and more particularly, to systems and fabrication methods for display panels integrated with a micro-lens array.

BACKGROUND

Display technologies are becoming increasingly popular in today's commercial electronic devices. These display panels are widely used in stationary large screens such as liquid crystal display televisions (LCD TVs) and organic light emitting diode televisions (OLED TVs) as well as portable electronic devices such as laptop personal computers, smartphones, tablets and wearable electronic devices. Much of development for the stationary large screens is directed to achieve a high viewing angle in order to accommodate and enable multiple audiences to see the screen from various angles. For example, various liquid crystal materials such as super twisted nematic (STN) and film compensated super twisted nematic (FSTN) have been developed to achieve a large viewing angle of each and every pixel light source in a display panel.

However, most of the portable electronic devices are designed mainly for single users, and screen orientation of these portable devices should be adjusted to be the best viewing angle for the corresponding users instead of a large viewing angle to accommodate multiple audiences. For example, a suitable viewing angle for a user may be perpendicular to the screen surface. In this case, compared with stationary large screens, light emitted at a large viewing angle is mostly wasted. Additionally, large viewing angles raise privacy concerns for portable electronic devices used in public areas.

In addition, in a conventional projection system based on a passive imager device, such as liquid crystal display (LCD), digital mirror devices (DMD), and liquid crystal on silicon (LCOS), the passive imager device itself does not emit light. Specifically, the conventional projection system projects images by optically modulating collimated light emitted from a light source, i.e., by either transmitting, e.g., by an LCD panel, or reflecting, e.g., by a DMD panel, part of the light at the pixel level. However, the part of the light that is not transmitted or reflected is lost, which reduces the efficiency of the projection system. Furthermore, to provide the collimated light, complex illumination optics are used to collect divergent light emitted from the light source. The illumination optics not only cause the system to be bulky but also introduce additional optical loss into the system, which further impacts the performance of the system. In a conventional projection system, typically less than 10% of the illumination light generated by the light source is used to form the projection image.

Light-emitting diodes (LEDs) made of semiconductor materials can be used in mono-color or full-color displays. In current displays that employs LEDs, the LEDs are usually used as the light source to provide the light to be optically modulated by, e.g., the LCD or the DMD panel. That is, the light emitted by the LEDs does not form images by itself. LED displays using LED panels including a plurality of LED dies as the imager devices have also been studied. In such an LED display, the LED panel is a self-emissive imager device, where each pixel can include one LED die (mono-color display) or a plurality of LED dies each of which represents one of primary colors (full-color display). However, the light emitted by the LED dies is generated from spontaneous emission and is thus not directional, resulting in a large divergence angle. The large divergence angle can cause various problems in an LED display. For example, due to the large divergence angle, the light emitted by the LED dies can be more easily scattered and/or reflected in the LED display. The scattered/reflected light can illuminate other pixels, resulting in light crosstalk between pixels, loss of sharpness, and loss of contrast.

SUMMARY

There is a need for improved display designs that improve upon, and help to address the shortcomings of conventional display systems, such as those described above. In particular, there is a need for display panels with reduced viewing angle for better protection for user's privacy, or/and reduced light waste for reduced power consumption and reduced light interference between pixels with better images.

Various embodiments include a display panel with integrated micro-lens array. The display panel typically includes an array of pixel light sources (e.g., LEDs, OLEDs) electrically coupled to corresponding pixel driver circuits (e.g., FETs). The array of micro-lenses is aligned to the pixel light sources and positioned to reduce the divergence of light produced by the pixel light sources. The display panel may also include an integrated optical spacer to maintain the positioning between the micro-lenses and pixel driver circuits.

The micro-lens array reduces the divergence angle of light produced by the pixel light sources and the useable viewing angle of the display panel. This, in turn, reduces power waste, increases brightness and/or better protects user privacy in public areas.

A display panel with integrated micro-lens array can be fabricated using a variety of manufacturing methods, resulting in a variety of device designs. In one aspect, the micro-lens array is fabricated directly as mesas or protrusions of the substrate with the pixel light sources. In some aspects, self-assembly, high temperature reflow, grayscale mask photolithography, molding/imprinting/stamping, and dry etching pattern transfer are techniques that can be used to fabricate micro-lens arrays.

Other aspects include components, devices, systems, improvements, methods and processes including manufacturing methods, applications, and other technologies related to any of the above.

In one aspect, a light emitting pixel unit includes at least one mesa formed on a substrate. The light emitting pixel unit also includes a micro-lens formed from a micro-lens layer that covers at least a top of the at least one mesa. In some embodiments, the material of the micro-lens layer is different from the material of the at least one mesa, and the micro-lens layer is in direct physical contact with the at least one mesa.

In some embodiments of the light emitting pixel unit, the micro-lens forms individually around the top of the at least one mesa.

In some embodiments of the light emitting pixel unit, a spacer is formed from the same micro-lens layer between the at least one mesa and the micro-lens.

In some embodiments of the light emitting pixel unit, the thickness of the spacer is not more than 1 micrometer.

In some embodiments of the light emitting pixel unit, the material of the spacer is as the same as material of the micro-lens.

In some embodiments of the light emitting pixel unit, the micro-lens is composed of a dielectric material.

In some embodiments of the light emitting pixel unit, the dielectric material comprises silicon oxide.

In some embodiments of the light emitting pixel unit, the material of the micro-lens is photoresist.

In some embodiments of the light emitting pixel unit, the height of the micro-lens is not more than 2 micrometers.

In some embodiments of the light emitting pixel unit, the width of the micro-lens is not more than 4 micrometers.

In some embodiments of the light emitting pixel unit, on the substrate, the at least one mesa is within a matrix of mesa array, and the micro-lens is within a matrix of micro-lens array placed according to the placement the mesa array.

In some embodiments of the light emitting pixel unit, the top of the at least one mesa is flat, and the shape of the micro-lens is hemisphere.

In some embodiments of the light emitting pixel unit, the at least one mesa includes at least a light emitting device.

In some embodiments of the light emitting pixel unit, the light emitting device includes a PN junction.

In another aspect, a method of fabricating a light emitting pixel unit includes: providing a substrate; forming at least one mesa on the substrate; and depositing a micro-lens material layer directly on at least a top of the at least one mesa. In some embodiments, the micro-lens material layer is conformed to a shape of the at least one mesa and has a shape of hemisphere on the at least one mesa.

In some embodiments of the method of fabricating a light emitting pixel unit, the micro-lens material layer is deposited by a chemical vapor deposition technology.

In some embodiments of the method of fabricating a light emitting pixel unit, some parameters of the chemical vapor deposition technology used to deposit the micro-lens material layer include: the power is 0 W to 1000 W, the pressure is 100 milli-torr to 2000 milli-torr, the temperature is 23° C. to 500° C., the gas flow rate is 0 sccm to 3000 sccm, and the time is 1 hour to 3 hours.

In some embodiments of the method of fabricating a light emitting pixel unit, the micro-lens material layer is composed of a dielectric material.

In some embodiments, the method of fabricating a light emitting pixel unit further includes: patterning the micro-lens material layer to expose an electrode area of the substrate.

In some embodiments of the method of fabricating a light emitting pixel unit, patterning further includes: forming a mask on the surface of the micro-lens material; patterning the mask via a photolithography process, thereby forming openings in the mask and exposing the micro-lens material layer above the electrode area of the at least one mesa; and with the mask protection in place, etching the portions of the micro-lens material layer exposed by the openings.

In some embodiments of the method of fabricating a light emitting pixel unit, etching is a wet etching method.

In yet another aspect, a method of fabricating a light emitting pixel unit, includes: providing a substrate; forming at least one mesa on the substrate; and depositing a micro-lens material layer directly on at least a top of the at least one mesa. In some embodiments, the micro-lens material layer covers the top of the at least one mesa and the top surface of the micro-lens material is flat. In some embodiments, the method of fabricating a light emitting pixel unit further includes patterning the micro-lens material layer from the top down, thereby forming at least a hemisphere in the micro-lens material layer, without passing through the micro-lens material layer. In some embodiments, the hemisphere is placed above the at least one mesa.

In some embodiments, the method of fabricating a light emitting pixel unit further includes: depositing a mask layer on the surface of the micro-lens material layer; patterning the mask layer to form a hemisphere pattern in the mask layer; and using the hemisphere pattern as a mask, etching the micro-lens material layer to form the hemisphere in the micro-lens material layer.

In some embodiments of the method of fabricating a light emitting pixel unit, after the micro-lens material layer is etched, the micro-lens material layer is not etched through to expose the top surface of the at least one mesa, thereby a spacer is formed on the top of the at least one mesa.

In some embodiments of the method of fabricating a light emitting pixel unit, the micro-lens material layer is deposited by spin coating.

In some embodiments of the method of fabricating a light emitting pixel unit, the mask layer is patterned by a photolithography process firstly and then a reflowing process.

In some embodiments of the method of fabricating a light emitting pixel unit, etching the micro-lens material layer is by a photolithography process.

In some embodiments, the method of fabricating a light emitting pixel unit further includes: after forming the at least one mesa and before depositing the micro-lens material layer, forming a mark layer with marks for aligning to the micro-lens material layer in the patterning process.

In some embodiments, the method of fabricating a light emitting pixel unit further includes: after patterning the micro-lens material layer, patterning the micro-lens material layer to expose an electrode area of the substrate.

The design of the display devices and systems disclosed herein utilizes the direct formation of the micro-lens on top of the mesas on the substrate by utilizing the conformity of the shape of the micro-lens material to the shape of the mesa, thereby greatly reducing the steps of the micro-lens fabrication and improving the efficiency of the display panel structure formation. Furthermore, the fabrication of the display systems can reliably and efficiently form the micro-lens structure patterns without using or retaining extra substrates. Reduced viewing angle and reduced light interference improve the light emission efficiency, resolution, and overall performance of the display systems. Thus, implementation of the display systems with micro-lens arrays can better satisfy the display requirements for Augmented Reality (AR) and Virtual Reality (VR), heads-up displays (HUD), mobile device displays, wearable device displays, high definition projectors, and automotive displays as compared with the use of conventional displays.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 3A is a top view of an example multi-color display panel with a square array arrangement of pixels, according to some embodiments.

FIG. 3B is a top view of an example multi-color display panel with a triangular array arrangement of the pixels, according to some embodiments.

Figure 1:
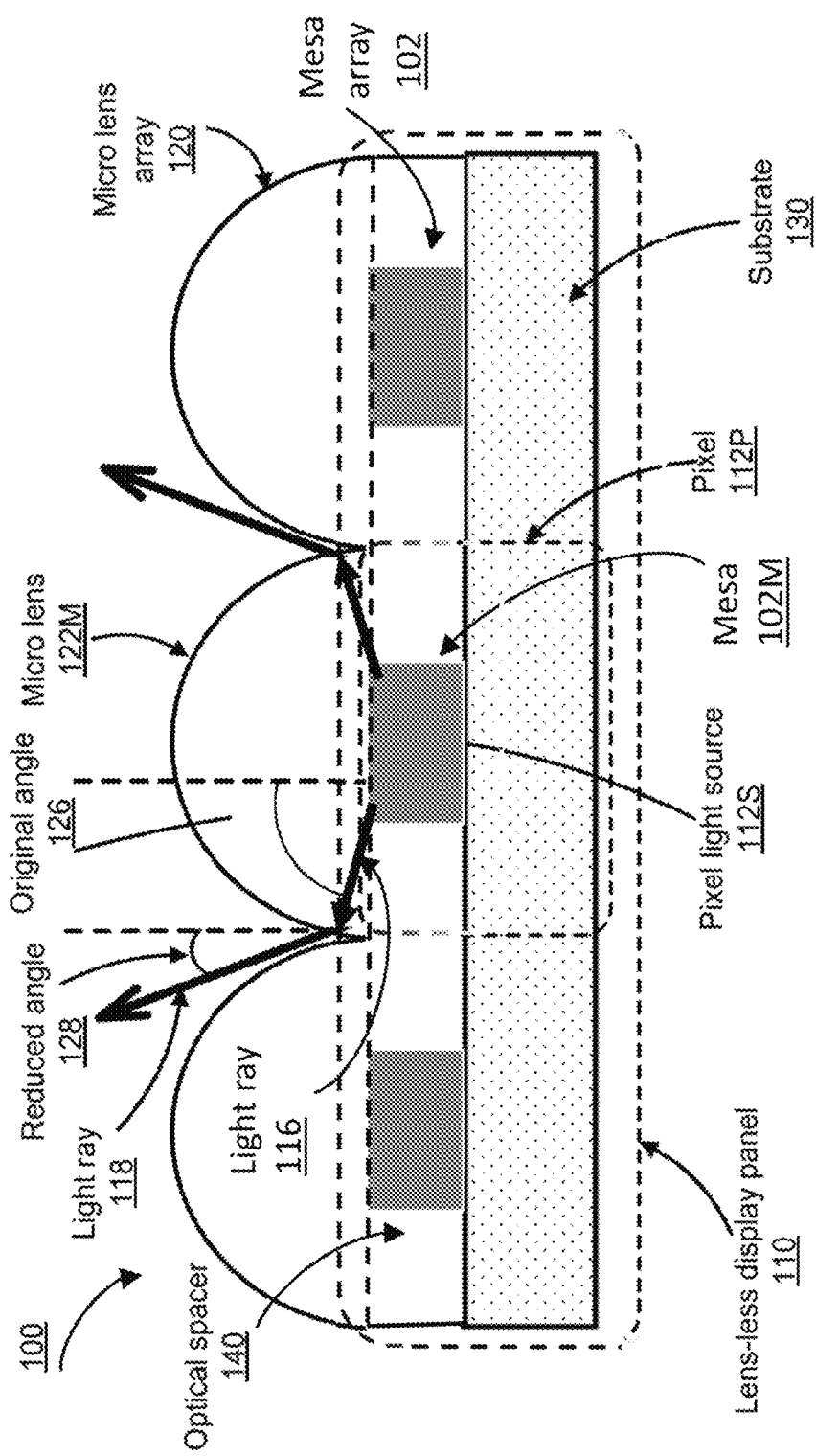
FIG. 1 is a cross-sectional view of an example display panel integrated with a micro-lens array, according to some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

As discussed above, in some examples, LED dies have a large divergence angle, which can cause various problems such as those discussed in the Background section. Moreover, in a projection system employing an LED array having a plurality of LED dies as a self-emissive imager device, a projection lens or a projection lens set is needed to project the image generated by the LED array, and the projection lens may have a limited numerical aperture. Thus, due to the large divergence angle of the LED dies, only a portion of the light emitted by the LED dies can be collected by the projection lens. This reduces the brightness of the LED-based projection system and/or increases the power consumption.

Embodiments consistent with the disclosure include an integrated display panel as a self-emissive imager device, including a substrate with an array of pixel driver circuits, an array of mesas which can include, for example, LED dies, formed over the substrate, and an array of micro-lens formed over the array of mesas, and methods of making the display panel. The display panel and projection systems based on the display panel combine the light source, the image forming function, and the light beam collimation function into a single monolithic device and are capable of overcoming the drawbacks of conventional projection systems.

FIG. 1 is a cross-sectional view of an example display panel 100 integrated with a micro-lens array 120, according to some embodiments. In FIG. 1, the finished display panel 100 includes a lens-less display panel 110 (i.e., without a micro-lens array), and a micro-lens array 120. The display panel 100 includes an array of individual mesas 102 within each individual pixel, such as shown at pixel 112P. In some embodiments, the mesa array 102 is formed on the substrate 130. In some embodiments, the substrate is a semiconductor substrate. In some embodiments, each of the pixels 112P further includes a pixel driver circuit (not shown in FIG. 1) and a corresponding pixel light source 112S within the individual mesa 102M. The micro-lens 122M within the micro-lens array 120 covers at least the top of the mesa 102M. In some embodiments, the micro-lens 122M covers and touches the mesa 102M directly. In some embodiments, the micro-lens 122M conforms to the shape of the mesa 102M and forms a hemisphere on the mesa 102M. For example, the micro-lens is formed on top and outside of the mesa 102M. In some embodiments, the composition of the micro-lens array 120 is different from the composition of the mesa 102M. In some embodiments, the top of the mesa 102M is generally flat and the shape of the micro-lens 122M is generally hemisphere. In some embodiments, the mesa 102 M is a circular platform. In some embodiments, the micro-lenses 122M are not in contact after they are formed on top of the mesas 102M.

In some embodiments, the micro-lens array 120 is made of dielectric materials such as silicon oxide. In some embodiments, the dielectric material is a transparent oxide, such as silicon nitride, silicon carbide, aluminum oxide, etc. In some embodiments, the micro-lens array 120 is made of photoresist. In some embodiments, the height of the micro-lens 122M is not more than 2 micrometers. In some embodiments, the height of the micro-lens 122M is not more than 1 micrometers. In some embodiments, the height of the micro-lens 122M is not more than 0.5 micrometers. In some embodiments, the width of the micro-lens 122M is not more than 4 micrometers. In some embodiments, the width of the micro-lens 122M is not more than 3 micrometers. In some embodiments, the width of the micro-lens 122M is not more than 2 micrometers. In some embodiments, the width of the micro-lens 122M is not more than 1 micrometers. In some embodiments, the ratio of the width and the height of the micro-lens 122M is more than 2.

Each pixel light source 112S is electrically coupled to and driven by the pixel driver circuit. The pixel light sources 112S are individually controllable. The micro-lens array 120 is formed above the lens-less display panel 110 with the micro-lenses 122M aligned to corresponding mesas 102 including the pixel light sources 112S (not separately shown on FIG. 1). For purposes of this disclosure, terms such as "above" and "top" means the direction of light propagating away from the pixel light source 112A and towards the viewer. The arrays of mesas 102 including pixel light sources 112S, the array of pixel driver circuits (not shown) and the array of micro-lenses are all integrated on a common substrate 130. In some embodiments, each of the pixel light sources 112S includes a PN junction.

For clarity, FIG. 1 shows in the display panel 100 only three individual pixels 112P, each of which includes one pixel light source 112S that corresponds to one single micro-lens 122M. It should be understood that a full display panel 100 will include an array of many individual pixels 112P and many micro-lenses 122M. In addition, a one to one correspondence between the micro-lenses 122M and the mesas 102M including pixel light sources 112S is not necessary, nor is a one to one correspondence between the pixel driver circuits (not shown) and the pixel light sources. Pixel light sources could also be made of multiple individual light elements, for example LEDs connected in parallel. In some embodiments, one micro-lense 122M can cover several mesas 102M.

The pixel light source 112S produces the light for the display panel 100. Different types of pixel light sources 112S can be used, for example, a micro LED array including an array of individual micro LEDs, a micro OLED array including an array of individual micro OLEDs, or a micro LCD array including an array of individual micro LCDs. Note that in the LCD array, the "pixel light source" actually modulates light produced from a backlight or elsewhere, as opposed to generating light from electricity, but will still be herein referred to as a pixel light source unless otherwise stated. In one embodiment, each individual pixel light source 112S includes a single light element. In another embodiment, each individual pixel light source 112S includes multiple light elements, for example LEDs coupled in parallel.

In FIG. 1, the micro-lens array 120 includes an array of individual micro-lenses 122M, and each micro-lens is aligned to a corresponding pixel light source 112S. The individual micro-lenses 122M have positive optical power and are positioned to reduce the divergence or viewing angle for light that is emitted from the corresponding pixel light source 112S, as shown by light rays 116-118 in FIG. 1. Light ray 116 represents the edge of the light beam emitted from the pixel light source 112S, which has an original divergence angle 126 that is fairly wide. In one embodiment, the original angle 126 is greater than 60 degrees. The light is bent by the micro-lens 122M, so that the new edge light ray 118 now has a reduced divergence angle 128. In one embodiment, the reduced angle 128 is less than 30 degrees. The micro-lenses 122M in the micro-lens array 120 are typically the same. Examples of micro-lenses include spherical micro-lenses, aspherical micro-lenses, Fresnal micro-lenses and cylindrical micro-lenses.

The micro-lens array 120 typically has a flat side and a curved side. In FIG. 1, the bottom of the micro-lens 122M is the flat side, and the top of the micro-lens 122M is the curved side. Typical shapes of the base of each micro-lens 122M include circle, square, rectangle, and hexagon. The individual micro-lenses 122M may be the same or different: in shape, curvature, optical power, size, base, spacing, etc. In the example of FIG. 1, the circular base of micro-lens 122M has a same width as the individual pixel 112P, but a smaller area since the micro-lens base is a circle and the individual pixel 112P is a square. In some embodiments, the micro-lens base area is larger than the area of the pixel light source 112S.

In some embodiments, an optical spacer 140 is formed between the lens-less display panel 110 and the micro-lens array 120. In some embodiments, an optical spacer 140 is formed between the array of mesas 102 and the micro-lens array 120.

The optical spacer 140 is an optically transparent layer that is formed to maintain the position of the micro-lens array 120 relative to the pixel light source array 112S. The optical spacer 140 can be made from a variety of materials that are transparent at the wavelengths emitted from the pixel light sources 112. Example transparent materials for the optical spacer 140 include polymers, dielectrics and semiconductors. The material for making the optical spacer 140 can be the same with or different from the material for making the micro-lens array 120. In some embodiments, where the micro-lens 122M is formed conforming to the shape of the mesa 102M, the optical spacer layer 140 can be formed with the micro-lens 122M in the same process with the same material. In some embodiments, the optical spacer layer 140 can be formed underneath the micro-lens 122M in the same process with the same material. In some embodiments, the height of the mesa 102M is larger than, the same, or smaller than the thickness of the optical spacer 140 measured from the bottom of the substrate 130.

The thickness of the optical spacer 140 is designed to maintain the proper spacing between the micro-lens array 120 and the pixel light source array 112S. As one example, for an optical spacer that maintains an optical spacing between pixel light source and micro-lens that is more than a focal length of the micro-lens, an image of a single pixel is formed at a certain distance. As another example, for an optical spacer that maintains an optical spacing between pixel light source and micro-lens that is less than a focal length of the micro-lens, a reduced divergence/viewing angle is achieved. The amount of reduction of divergence/viewing angle also partly depends on the thickness of the optical spacer 140 measured from the top surface of the mesa 102M. In some embodiments, the thickness of the spacer 140 measured from the top surface of the mesa 102M is not more than 1 micrometer. In some embodiments, the thickness of the optical spacer 140 measured from the top surface of the mesa 102M is not more than 0.5 micrometer. In some embodiments, the thickness of the optical spacer 140 measured from the top surface of the mesa 102M is not more than 0.2 micrometer. In some embodiments, the thickness of the optical spacer 140 measured from the top surface of the mesa 102M is about 1 micrometer. In some embodiments, the material of the optical spacer 140 is the same as the material of the micro-lens array 120.

In some embodiments, a brightness enhancement effect is achieved via integrating a micro-lens array onto the display panel. In some examples, the brightness with the micro-lens array is 4 times the brightness without the micro-lens array in the direction perpendicular to the display surface, due to light concentrating effect of micro-lenses. In alternative embodiments, the brightness enhancement factor can vary according to different designs of the micro-lens array and the optical spacer. For example, a factor greater than 8 can be achieved.

Figure 2B:
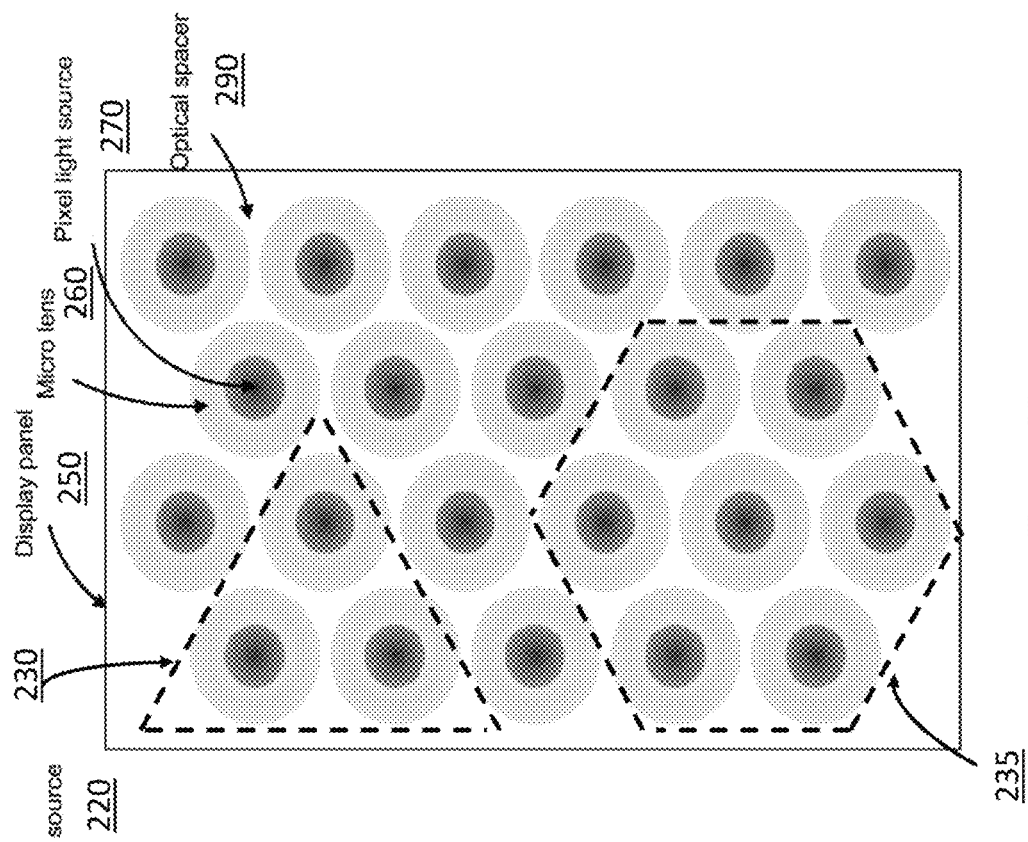
FIG. 2B is a top view of an example single-color display panel illustrating a triangular and a hexagonal array arrangements of the pixels, according to one embodiment.
Figure 2A:
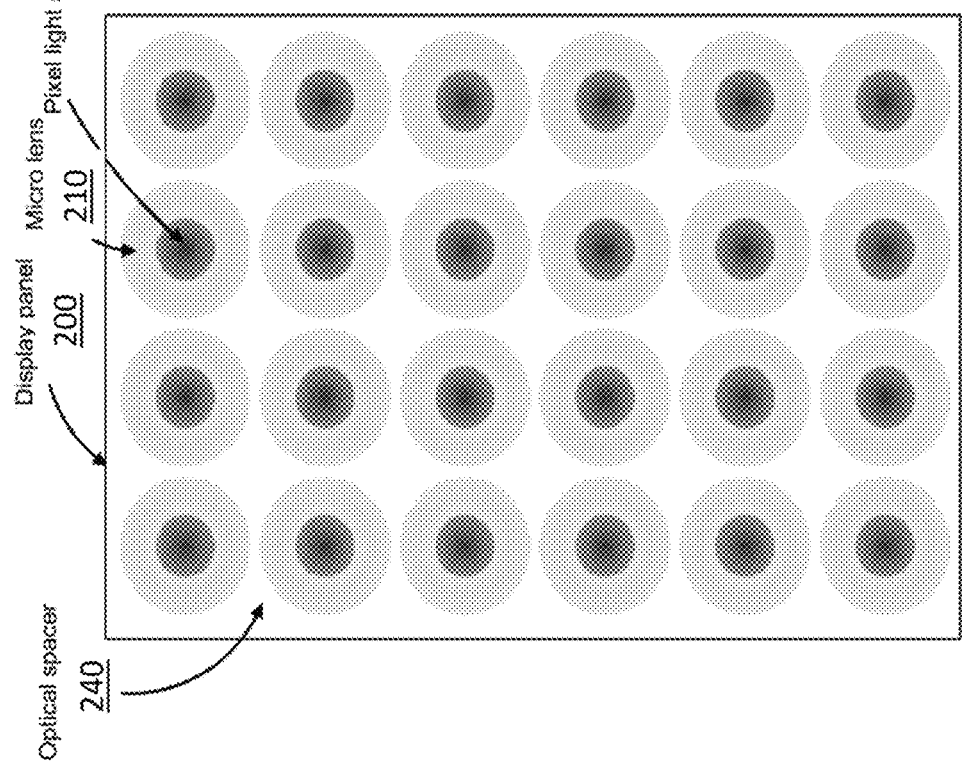
FIG. 2A is a top view of an example single-color display panel with a square array arrangement of the pixels, according to some embodiments.

FIGS. 2A-2B are top views of example single-color display panels integrated with a spherical micro-lens array, according to some embodiments. More specifically, FIG. 2A is a top view of an example single-color display panel 200 with a square array arrangement of the pixels, and FIG. 2B is a top view of an example single-color display panel 250 illustrating a triangular and a hexagonal array arrangements of the pixels. As an example, an embodiment of a triangular array arrangement 230 and an embodiment of a hexagonal array arrangement 235 are shown in FIG. 2B. Both display panels 200, 250 include an array of micro-lenses 210, 260, an array of mesas including pixel light sources 220, 270 below the micro-lenses 210, and optional optical spacers 240, 290 formed between the micro-lens array and the mesa array. Each individual micro-lens is aligned to a mesa including individual pixel light source. In more detail, the display panel 200 with the square matrix arrangement includes an array of individual micro-lenses 210, a corresponding array of mesas including pixel light sources 220 and an optional optical spacer 240 in between, and the display panel 250 with the triangular matrix or hexagonal arrangement includes an array of individual micro-lenses 260, a corresponding array of mesas including pixel light sources 270, and an optional optical spacer 290 in between. In both display panels 200, 250, the pixel light sources are single-color pixel light sources which all produce the same color light, for example, single color LEDs, which forms single-color display panels.

In FIGS. 2A-2B, the individual micro-lenses 210, 260 of the corresponding display panel 200, 250 are spherical micro-lenses arranged in a square, triangular or hexagonal matrix. In alternate embodiments, the micro-lenses can have non-spherical shapes. The micro-lenses can also be arranged in other matrix arrangements, such as a rectangular matrix arrangement, or an octagonal matrix arrangement, or combinations of geometric matrix arrangements.

FIGS. 3A-3B are top views of example multi-color display panels integrated with a spherical micro-lens array, according to some embodiments. More specifically, FIG. 3A is a top view of an example multi-color display panel 300 with a square array arrangement of pixels, and FIG. 3B is a top view of an example multi-color display panel 350 with a triangular array arrangement of the pixels. Both display panels 300, 350 include an array of micro-lenses 310, 360, an array of mesas including pixel light sources 320, 370 and an optional optical spacer 340, 390 formed between the micro-lens array and the pixel light source array, and each micro-lens is aligned to a corresponding mesa including individual pixel light source.

In more detail, the display panel 300 with the square matrix arrangement includes an array of individual micro-lenses 310, a corresponding array of mesas including pixel light sources 320 and an optional optical spacer 340 in between. Different from the single-color display panels 200, 250 shown in FIGS. 2A-2B, the pixel light source array in the display panel 300 include pixel light sources associated with different emission wavelengths, resulting in a multi-color display panel. For example, the pixel light source 320R produces red light and the corresponding micro-lens 310R is aligned to the red pixel light source, the pixel light source 320G produces green light and the corresponding micro-lens 310G is aligned to the green pixel light source, and the pixel light source 320B produces blue light and the corresponding micro-lens 310B is aligned to the blue pixel light source. In one embodiment, several pixel light sources 320 with different colors are grouped together in a certain ratio to form an RGB full color pixel. For example, several pixel light sources 320 with different colors are grouped together with a triangular, rectangular or hexagonal matrix arrangement. For example, in a common design, red pixel light sources 320R, green pixel light sources 320G and blue pixel light sources 320B are grouped in a ratio of 1:2:1 to form a single full color pixel 330 with a 2 by 2 square arrangement of light sources.

In FIGS. 3A-3B, the individual micro-lenses 310, 360 of the corresponding display panel 300, 350 are spherical micro-lenses. In alternate embodiments, the micro-lenses can have non-spherical shapes. The micro-lenses can also be arranged in other matrix arrangements, such as a rectangular matrix arrangement or a hexagonal matrix arrangement.

The display panel 350 with the triangular matrix arrangement also includes an array of individual micro-lenses 360, a corresponding array of mesas including pixel light sources 370 and an optical spacer 390 in between, and the pixel light sources 370 are also associated with different emission wavelengths to provide different light colors. For example, the pixel light source 370R emits red light and the corresponding micro-lens 360R is aligned to the red pixel light source, the pixel light source 370G emits green light and the corresponding micro-lens 360G is aligned to the green pixel light source, and the pixel light source 370B emits blue light and the corresponding micro-lens 360B is aligned to the blue pixel light source. In this example, red pixel light sources 320R, green pixel light sources 320G and blue pixel light sources 320B are grouped in a ratio of 1:1:1 to form a single full color pixel 380 with a triangular arrangement of light sources. In some embodiments, a cylindrical micro-lens array can be formed on top of the mesas.

Figure 4:
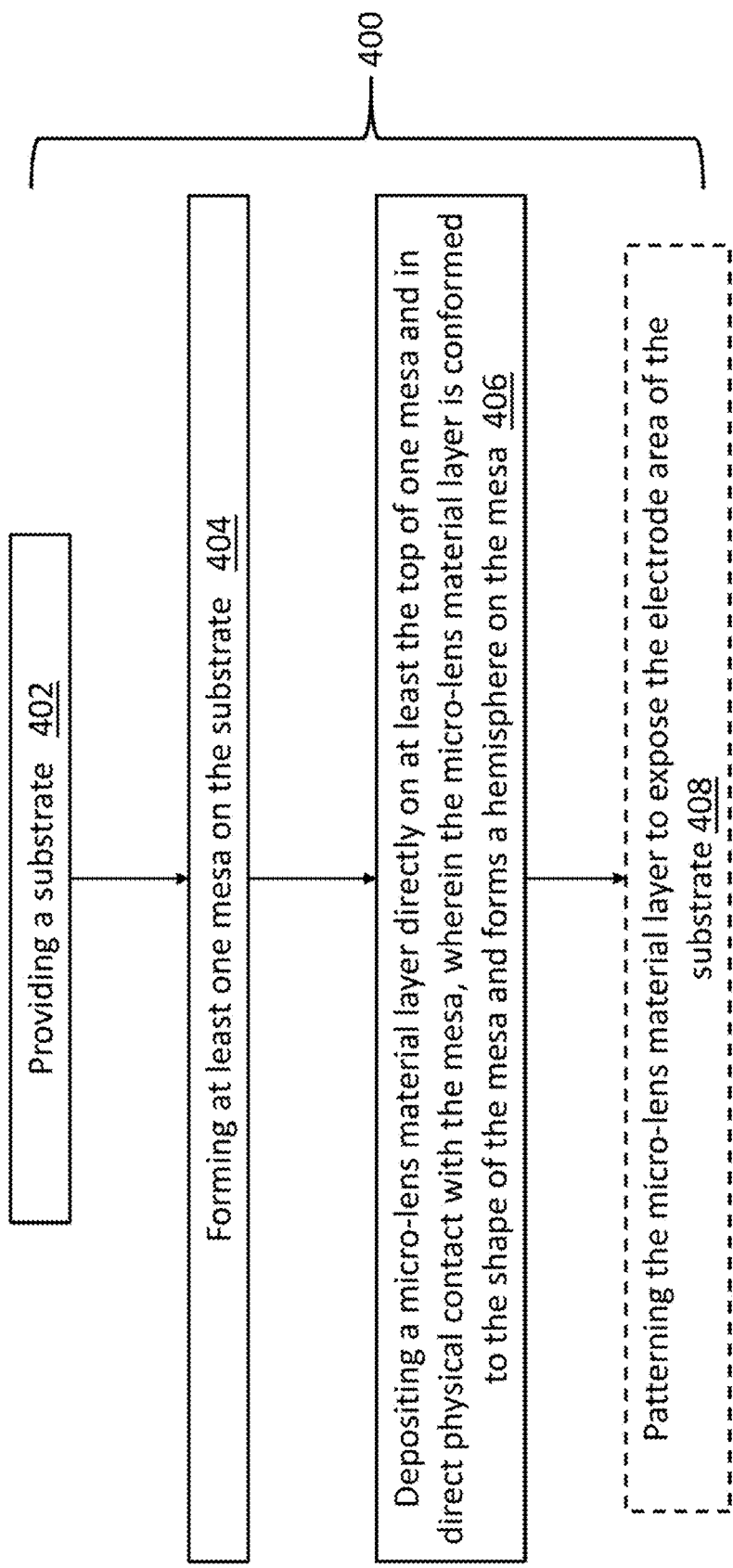
FIG. 4 shows a flow diagram of a fabrication method to form a light emitting pixel unit on a display panel integrated with a micro-lens array, according to some embodiments.
Figure 5:
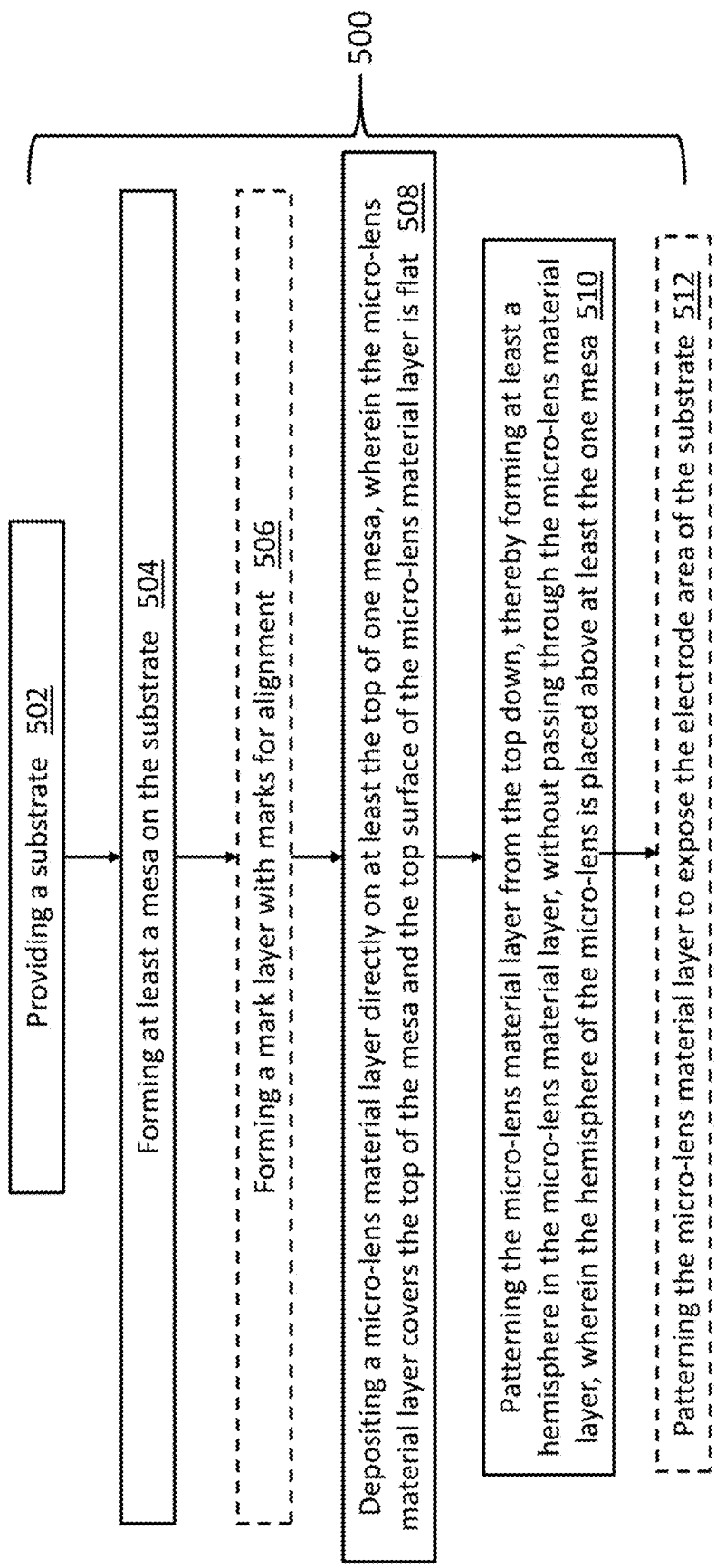
FIG. 5 shows a flow diagram of a fabrication method to form a light emitting pixel unit on a display panel integrated with a micro-lens array, according to some embodiments.

FIGS. 4-5 show examples of different fabrication methods to form a display panel integrated with a micro-lens array, according to various embodiments.

FIG. 4 shows a flow diagram of a fabrication method to form a light emitting pixel unit on a display panel integrated with a micro-lens array, according to some embodiments. Operations (e.g., steps) of the method 400 may be performed corresponding to embodiments described in FIG. 1.

The method 400 includes a step 402 of providing a substrate. For example, FIG. 1 shows a cross-sectional view of a substrate 130. In some embodiments, the substrate 130 is a semiconductor substrate such as silicon. In some embodiments, the material of the substrate 130 is from the groups II~III compound, Sapphire, aluminum oxide, gallium nitride, and so on.

The method 400 also includes a step 404 of forming at least one mesa on the substrate. In some embodiments, the mesa is a flat-topped protrusion from the substrate with steep sides which is formed by existing semiconductor fabrication methods such as deposition, photolithography and etching. In some embodiments, the mesas can be in the shape of rectangle, square, triangle, trapezoid, polygon, etc. In some embodiments, the mesa includes at least a PN junction. For example, FIG. 1 shows a cross-sectional view of a mesa 102M. The substrate 130 already includes an integrated array of individual pixels 112P that each has a corresponding pixel light source 112S within the mesa 102M. In one embodiment, an array of pixel driver circuits (not shown) that control the corresponding pixel light source array is also integrated on the substrate 130. The embodiments in FIG. 4 start from this structure, which is referred to as the lens-less display panel 110 as shown in FIG. 1.

The method 400 further includes a step 406 of depositing a micro-lens material layer directly on at least the top of one mesa and in direct physical contact with the mesa. In some embodiments, as shown in FIG. 1, the shape of the micro-lens material layer is conformed to the shape of the mesa 102M and forms a hemisphere on the mesa. In some embodiments, the top of the mesa 102M is generally flat and the shape of the formed micro-lens 122M is generally hemispheric. In some embodiments, the micro-lens material layer is deposited on the substrate directly by chemical vapor deposition (CVD) technology. In some embodiments, the deposition parameters for the CVD process are: the power is about 0 W to about 1000 W, the pressure is about 100 milli-torr to about 2000 milli-torr, the temperature is around 23° C. to around 500° C., the gas flow is about 0 to about 3000 sccm (standard cubic centimeters per minute), and the time is about 1 hour to about 3 hours. In some embodiments, the material of the micro-lens material layer is a dielectric material such as silicon dioxide.

The method 400 further includes a step 408 of patterning the micro-lens material layer to expose the electrode area (not shown in FIG. 1) of the substrate. In some embodiments, the step 408 of patterning the micro-lens material layer includes an etching step. In some embodiments, the etching step includes a step of forming a mask on the surface of the micro-lens material. The etching step also includes a step of patterning the mask via a photolithography process, thereby forming openings in the mask and exposing the micro-lens material layer above the electrode area of the mesa. The etching step further includes a step of etching the portions of the micro-lens material layer exposed by the openings with the mask protection in place. In some embodiments, the exposed micro-lens material layer is etched by a wet etching method.

FIG. 5 shows a flow diagram of a fabrication method to form a light emitting pixel unit on a display panel integrated with a micro-lens array, according to some embodiments. Operations (e.g., steps) of the method 500 may be performed corresponding to embodiments described in FIG. 1.

The method 500 includes a step 502 of providing a substrate. For example, FIG. 1 shows a cross-sectional view of a substrate 130. In some embodiments, the substrate 130 is a semiconductor substrate such as silicon.

The method 500 also includes a step 504 of forming at least a mesa on the substrate. In some embodiments, the mesa is a flat-topped protrusion from the substrate with steep sides which is formed by existing semiconductor fabrication methods such as deposition, photolithography and etching. In some embodiments, the mesas can be in the shape of rectangle, square, triangle, trapezoid, polygon, etc. In some embodiments, the mesa includes at least a PN junction. For example, FIG. 1 shows a cross-sectional view of a mesa 102M. The substrate 130 already includes an integrated array of individual pixels 112P that each has a corresponding pixel light source 112S within the mesa 102M. In one embodiment, an array of pixel driver circuits (not shown) that control the corresponding pixel light source array is also integrated on the substrate 130. The embodiments in FIG. 5 start from this structure, which is referred to as the lens-less display panel 110 as shown in FIG. 1.

In some embodiments, the method 500 also includes an optional step 506 of forming a mark layer with marks for aligning to the micro-lens material layer deposited in later steps. For example, the mark layer is formed to align the units of the light emitting pixels to the micro-lens material layer in order to form the micro-lens at the center of the light emitting pixel. In some embodiments, the mark layer is formed to align the mesa to the layers above it especially the micro-lens material layer in order to form the micro-lens on the top of the mesa.

Figure 6A:
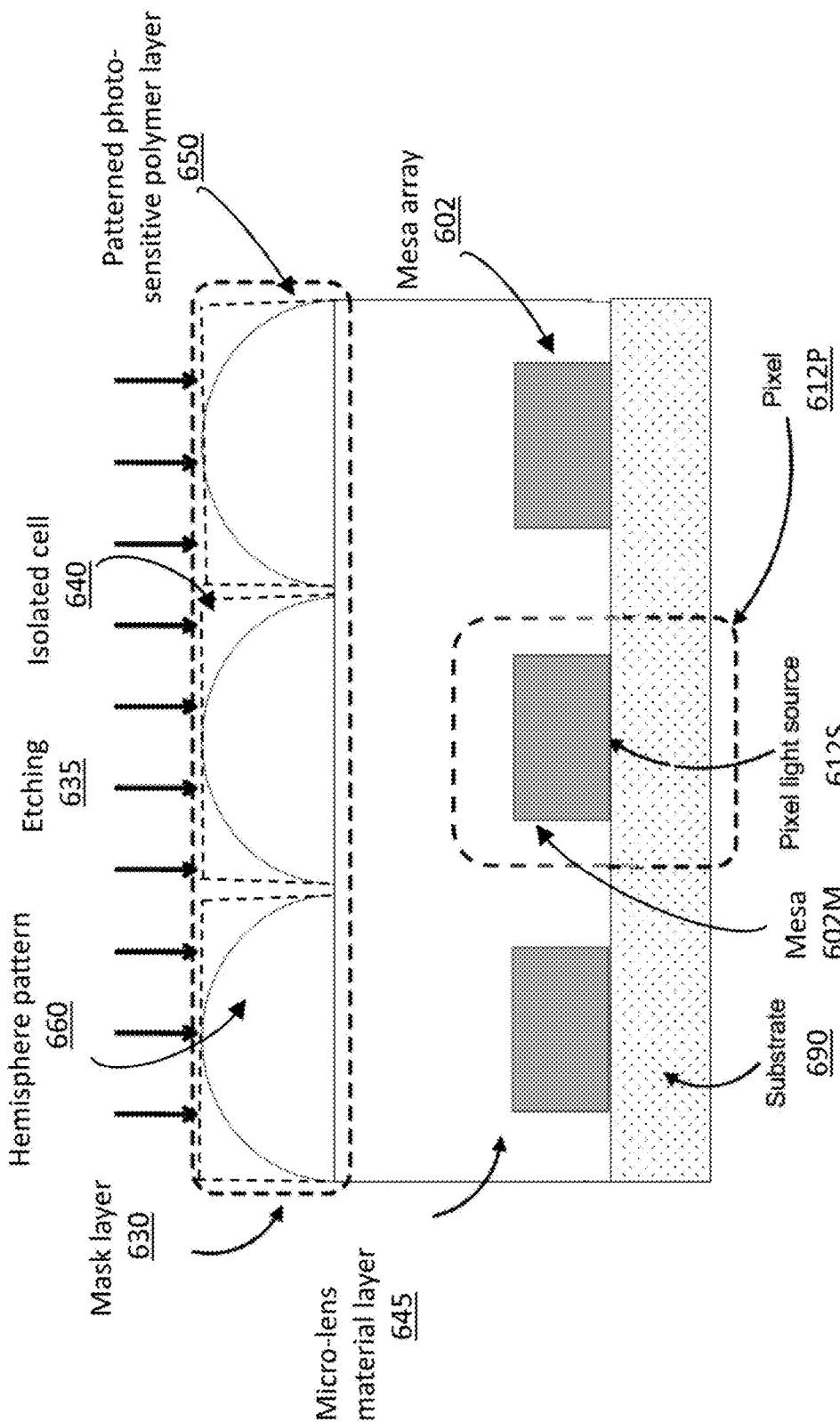
FIG. 6A shows a fabrication method to form a display panel integrated with a micro-lens array using top down pattern transfer, according to some embodiments.
Figure 6B:
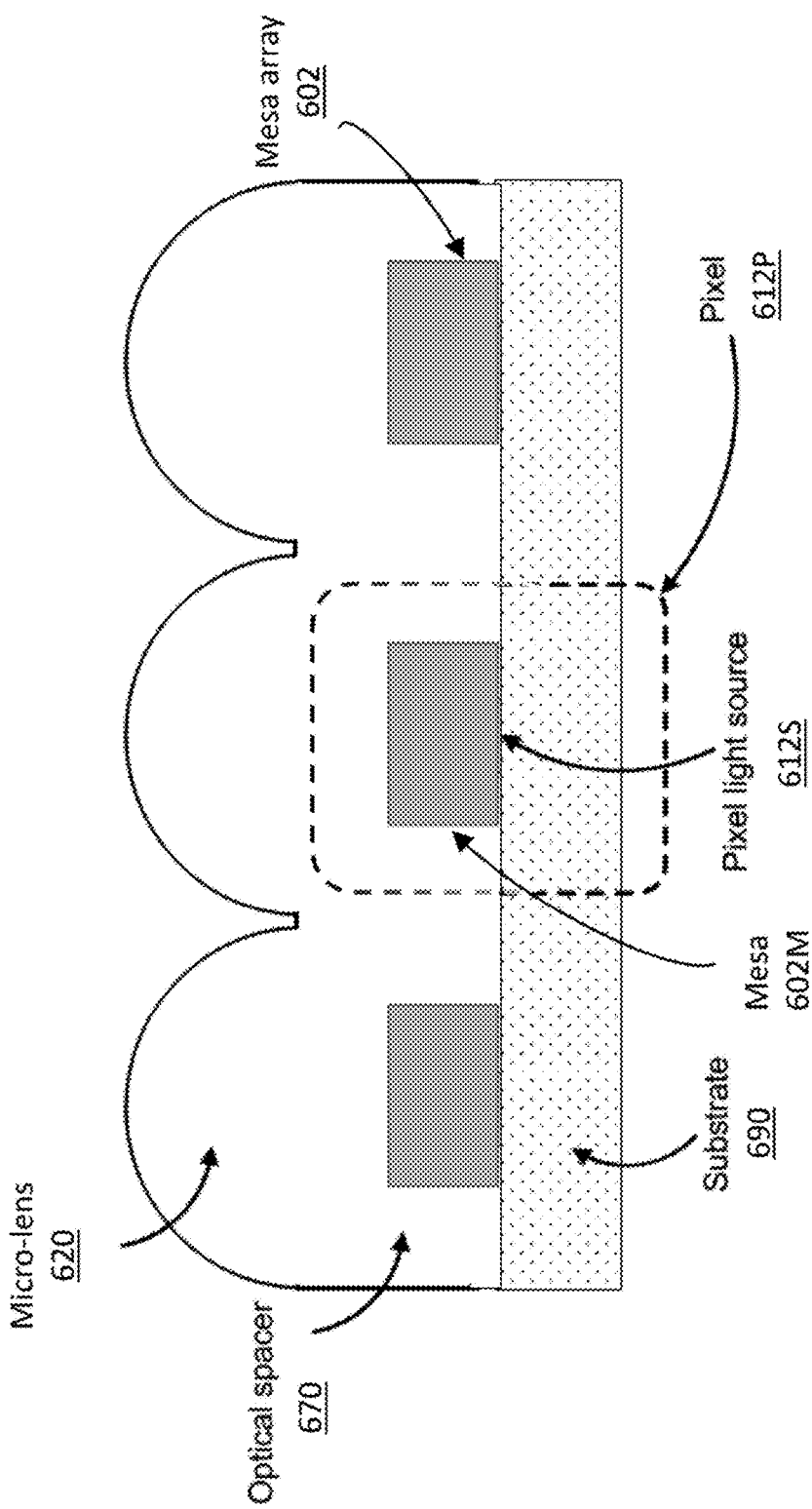
FIG. 6B shows a fabrication method to form a display panel integrated with a micro-lens array using top down pattern transfer, according to some embodiments.

The method 500 further includes a step 508 of depositing a micro-lens material layer directly on at least the top of one mesa. FIGS. 6A-6B further show a fabrication method to form a display panel integrated with a micro-lens array using top down pattern transfer, according to some embodiments. In some embodiments, the micro-lens material layer 645 covers the top of the mesa 602M as shown in FIG. 6A and the top surface of the micro-lens material layer 645 is flat. In some embodiments, the micro-lens material layer 645 is deposited on the top of the mesa array 602 by spin coating. In some embodiments, the material of the micro-lens material layer 645 is photoresist. In some embodiments, the material of the micro-lens material layer 645 is dielectric material such as silicon oxide.

The method 500 further includes a step 510 of patterning the micro-lens material layer from the top down, thereby forming at least a hemisphere in the micro-lens material layer as shown in FIGS. 6A-6B. In some embodiments, the patterning is carried out without passing through or etching to the bottom of the micro-lens material layer 645. In some embodiments, the hemisphere of the micro-lens 620 is placed above at least one mesa 602M.

In some embodiments, the step 510 further includes a first step of depositing a mask layer 630 on the surface of the micro-lens material layer 645 as shown in FIG. 6A.

The step 510 also includes a second step of patterning the mask layer 630 to form a hemisphere pattern in the mask layer 630. In some examples, the mask layer 630 is patterned by a photolithography process firstly and then a reflowing process. In some embodiments, the photo-sensitive polymer mask layer 630 is patterned into isolated cells 640, as shown in FIG. 6A in dotted rectangle cells, to prepare for the formation of the hemisphere pattern. As one example, the isolated cells 640 are patterned and formed via a photolithography process. The patterned photo-sensitive polymer mask layer 650 with the isolated cells 640 is then shaped into hemisphere pattern 660 using high temperature reflow process. In one approach, the isolated cells 640 are formed into isolated hemisphere pattern 660 via high temperature reflow. In some embodiments, the isolated hemisphere pattern 660 of one pixel is not in direct physical contact with a hemisphere pattern of an adjacent pixel. In some embodiments, the hemisphere pattern 660 of one pixel only contacts with a hemisphere pattern of an adjacent pixel at the bottom of the hemisphere pattern 660. The patterned photo-sensitive polymer mask layer 650 is heated to a temperature above the melting point of the polymer material for a certain time. After the polymer material melts into a liquefied state, the surface tension of the liquefied material will render it into a shape with a smooth curvature surface. For a cell with a round base of a radius R when the height of the cell is 2R/3, a hemispherical shape/pattern will be formed after the reflow process. FIG. 6A shows a display panel integrated with the array of hemisphere patterns 660 after the high temperature reflow process is finished. In some embodiments, the hemisphere pattern in the mask layer can be formed by other fabrication method including the fabrication method for the micro-lens described in method 400. In some other embodiments, the hemisphere pattern in the mask layer can be formed using grayscale mask photolithography exposure. In some other embodiments, the hemisphere pattern in the mask layer can be formed via a mold/imprinting process.

The step 510 further includes a third step of using the hemisphere pattern 660 as a mask, etching the micro-lens material layer 645 to form the hemisphere in the micro-lens material layer 645. In some examples, etching the micro-lens material layer 645 is by a photolithography process. In some examples, etching the micro-lens material layer 645 is by a dry etching such as plasma etching process 635 as shown in FIG. 6A. In some embodiments, after the micro-lens material layer 645 is etched, the micro-lens material layer 645 is not etched through to expose the top surface of the mesa 602M as shown in FIGS. 6A-6B, thereby a spacer 670 is formed on the top of the mesa 602M or covering the top of the mesa 602M as shown in FIG. 6B.

The method 500 further includes a step 512 of patterning the micro-lens material layer to expose the electrode area (not shown in FIG. 6B) of the substrate. In some embodiments, the step 512 of patterning the micro-lens material layer includes an etching step. In some embodiments, the etching step includes a step of forming a mask on the surface of the micro-lens material. The etching step also includes a step of patterning the mask via a photolithography process, thereby forming openings in the mask and exposing the micro-lens material layer above the electrode area of the mesa. The etching step further includes a step of etching the exposed micro-lens material layer with the mask protection. In some embodiments, the exposed micro-lens material layer is etched by a wet etching method. In some embodiments, the opening for an electrode is positioned outside the display array area.

As described above, FIGS. 1, 4, 5, 6A, and 6B show various fabrication methods to form a display panel integrated with a micro-lens array. It should be understood that these are merely examples, and other fabrication techniques can also be used.

Although the detailed description contains many specifics, these should not be construed as limiting the scope of the invention but merely as illustrating different examples and aspects of the invention. It should be appreciated that the scope of the invention includes other embodiments not discussed in detail above. For example, micro-lenses with different shape bases may also be used, such as square base or other polygon base. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

Further embodiments also include various subsets of the above embodiments including embodiments shown in FIGS. 1, 2A, 2B, 3A, 3B, 4, 5, 6A, and 6B combined or otherwise re-arranged in various other embodiments.

Figure 7:
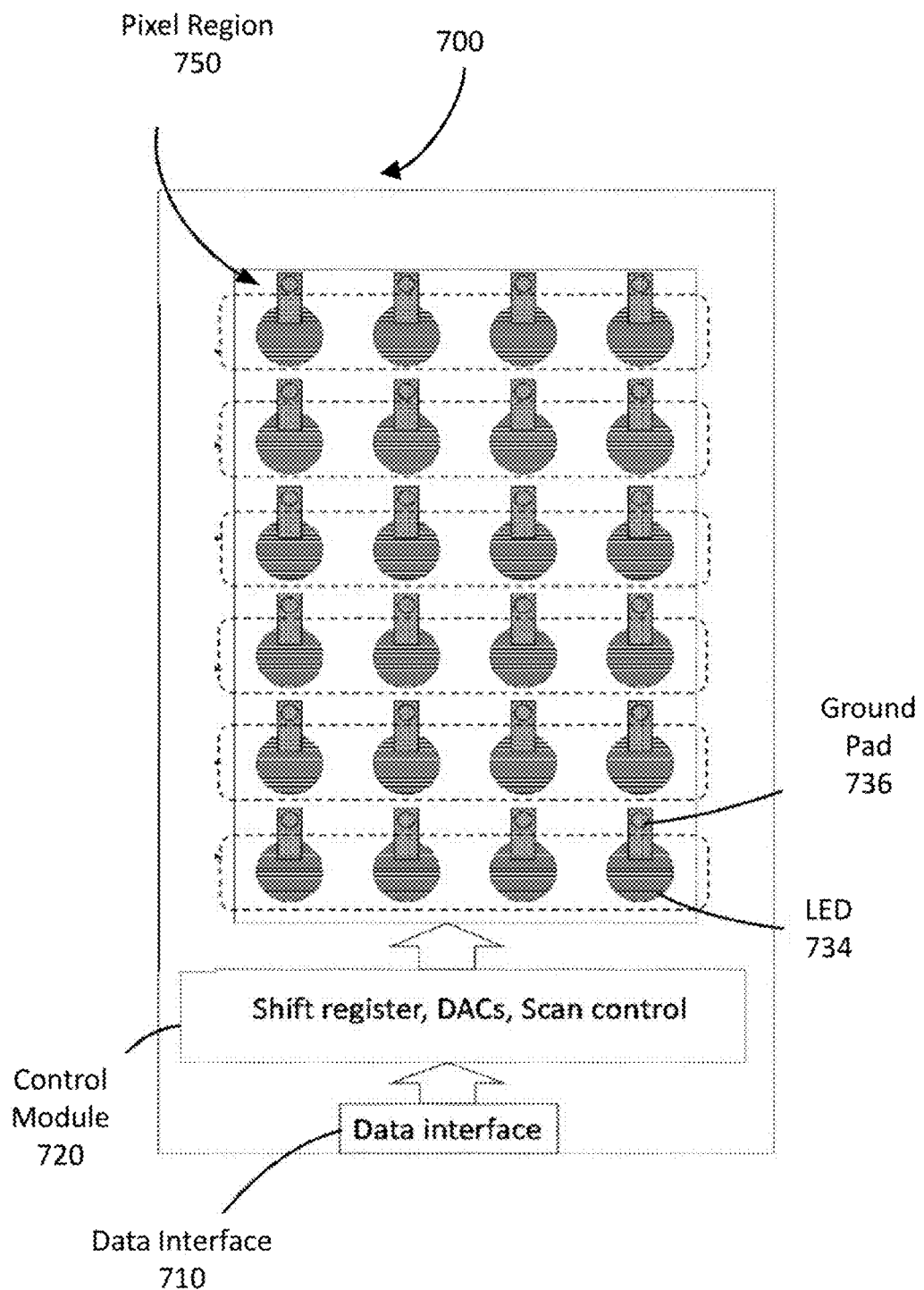
FIG. 7 is a top view of a micro LED display panel, in accordance with some embodiments.

FIG. 7 is a top view of a micro LED display panel 700, in accordance with some embodiments. The display panel 700 includes a data interface 710, a control module 720 and a pixel region 750. The data interface 710 receives data defining the image to be displayed. The source(s) and format of this data will vary depending on the application. The control module 720 receives the incoming data and converts it to a form suitable to drive the pixels in the display panel. The control module 720 may include digital logic and/or state machines to convert from the received format to one appropriate for the pixel region 750, shift registers or other types of buffers and memory to store and transfer the data, digital-to-analog converters and level shifters, and scan controllers including clocking circuitry.

The pixel region 750 includes an array of mesas (not separately shown from the LED 734 in FIG. 7) including pixels. The pixels include micro LEDs, such as a single color or multi-color LED 734, integrated with pixel drivers, for example as described above. An array of micro-lens (not separately shown from the LED 734 in FIG. 7) covers the top of the array of mesas. In this example, the display panel 700 is a color RGB display panel. It includes red, green and blue pixels. Within each pixel, the LED 734 is controlled by a pixel driver. The pixel makes contact to a supply voltage (not shown) and ground via a ground pad 736, and also to a control signal, according to the embodiments shown previously. Although not shown in FIG. 7, the p-electrode of the LED 734 and the output of the driving transistor are electrically connected. The LED current driving signal connection (between p-electrode of LED and output of the pixel driver), ground connection (between n-electrode and system ground), the supply voltage Vdd connection (between source of the pixel driver and system Vdd), and the control signal connection to the gate of the pixel driver are made in accordance with various embodiments. Any of the micro-lens array disclosed herein can be implemented with the micro LED display panel 700.

FIG. 7 is merely a representative figure. Other designs will be apparent. For example, the colors do not have to be red, green and blue. They also do not have to be arranged in columns or stripes. As one example, apart from the arrangement of a square matrix of pixels shown in FIG. 7, an arrangement of hexagonal matrix of pixels can also be used to form the display panel 700.

In some applications, a fully programmable rectangular array of pixels is not necessary. Other designs of display panels with a variety of shapes and displays may also be formed using the device structures described herein. One class of examples is specialty applications, including signage and automotive. For example, multiple pixels may be arranged in the shape of a star or a spiral to form a display panel, and different patterns on the display panel can be produced by turning on and off the LEDs. Another specialty example is automobile headlights and smart lighting, where certain pixels are grouped together to form various illumination shapes and each group of LED pixels can be turned on or off or otherwise adjusted by individual pixel drivers.

Even the lateral arrangement of devices within each pixel can vary. In FIGS. 1, 6A, and 6B, the LEDs and pixel drivers are arranged vertically, i.e., each LED is located on top of the corresponding pixel driver circuit. Other arrangements are possible. For example, the pixel drivers could also be located "behind", "in front of", or "beside" the LED.

Different types of display panels can be fabricated. For example, the resolution of a display panel can range typically from 8×8 to 3840×2160. Common display resolutions include QVGA with 320×240 resolution and an aspect ratio of 4:3, XGA with 1024×768 resolution and an aspect ratio of 4:3, D with 1280×720 resolution and an aspect ratio of 16:9, FHD with 1920×1080 resolution and an aspect ratio of 16:9, UHD with 3840×2160 resolution and an aspect ratio of 16:9, and 4K with 4096×2160 resolution. There can also be a wide variety of pixel sizes, ranging from sub-micron and below to 10 mm and above. The size of the overall display region can also vary widely, ranging from diagonals as small as tens of microns or less up to hundreds of inches or more.

Different applications will also have different requirements for optical brightness and viewing angle. Example applications include direct viewing display screens, light engines for home/office projectors and portable electronics such as smart phones, laptops, wearable electronics, AR and VR glasses, and retinal projections. The power consumption can vary from as low as a few milliwatts for retinal projectors to as high as kilowatts for large screen outdoor displays, projectors, and smart automobile headlights. In terms of frame rate, due to the fast response (nanoseconds) of inorganic LEDs, the frame rate can be as high as KHz, or even MHz for small resolutions.

Further embodiments also include various subsets of the above embodiments including embodiments as shown in FIGS. 1, 2A, 2B, 3A, 3B, 4, 5, 6A, 6B, and 7 combined or otherwise re-arranged in various other embodiments.

Although the detailed description contains many specifics, these should not be construed as limiting the scope of the invention but merely as illustrating different examples and aspects of the invention. It should be appreciated that the scope of the invention includes other embodiments not discussed in detail above. For example, the approaches described above can be applied to the integration of functional devices other than LEDs and OLEDs with control circuitry other than pixel drivers. Examples of non-LED devices include vertical cavity surface emitting lasers (VCSEL), photodetectors, micro-electro-mechanical system (MEMS), silicon photonic devices, power electronic devices, and distributed feedback lasers (DFB). Examples of other control circuitry include current drivers, voltage drivers, trans-impedance amplifiers, and logic circuits.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

Features of the present invention can be implemented in, using, or with the assistance of a computer program product, such as a storage medium (media) or computer readable storage medium (media) having instructions stored thereon/in which can be used to program a processing system to perform any of the features presented herein. The storage medium can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory optionally includes one or more storage devices remotely located from the CPU(s). Memory or alternatively the non-volatile memory device(s) within the memory, comprises a non-transitory computer readable storage medium.

Stored on any machine readable medium (media), features of the present invention can be incorporated in software and/or firmware for controlling the hardware of a processing system, and for enabling a processing system to interact with other mechanisms utilizing the results of the present invention. Such software or firmware may include, but is not limited to, application code, device drivers, operating systems, and execution environments/containers.

It will be understood that, although the terms "first," "second," etc. may be used herein to describe various elements or steps, these elements or steps should not be limited by these terms. These terms are only used to distinguish one element or step from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of fabricating a light emitting pixel unit, comprising:
    providing a substrate;
    forming at least one mesa on the substrate; and
    depositing a micro-lens material layer directly by a chemical vapor deposition process on at least a top of the at least one mesa, the micro-lens material layer forming at least one micro-lens with a shape of hemisphere on the at least one mesa during the chemical vapor deposition process by conforming to a shape of the at least one mesa,
    wherein
    a height of the at least one micro-lens is not more than 2 micrometers, and a width of the at least one micro-lens is not more than 4 micrometers,
    a thickness of a micro-lens of the at least one micro-lens at a center top of a mesa of the at least one mesa is thicker than a thickness of the micro-lens at an edge top of the mesa to reduce a divergence of light produced by the mesa, and,
    the shape of hemisphere of the micro-lens material layer, and a positioning of the shape of hemisphere to reduce the divergence of light produced by the at least one mesa are formed during the deposition by the chemical vapor deposition process.

2. The method of fabricating the light emitting pixel unit according to claim 1,
    wherein:
        material of the micro-lens material layer is different from material of the at least one mesa.

3. The method of fabricating the light emitting pixel unit according to claim 1, wherein the micro-lens forms individually during the deposition by the chemical vapor deposition process around the top of the mesa.

4. The method of fabricating the light emitting pixel unit according to claim 1, wherein a spacer is formed from the same micro-lens material layer between the at least one mesa and the micro-lens.

5. The method of fabricating the light emitting pixel unit according to claim 4, wherein material of the spacer is as the same as material of the micro-lens.

6. The method of fabricating the light emitting pixel unit according to claim 1, wherein the micro-lens is composed of a dielectric material.

7. The method of fabricating the light emitting pixel unit according to claim 1, wherein material of the micro-lens is photoresist.

8. The method of fabricating the light emitting pixel unit according to claim 1, wherein the height of the micro-lens is not more than 1 micrometer.

9. The method of fabricating the light emitting pixel unit according to claim 1, wherein the width of the micro-lens is not more than 3 micrometers.

10. The method of fabricating the light emitting pixel unit according to claim 1, wherein, on the substrate, the mesa is within a matrix of mesa array, and the micro-lens is within a matrix of micro-lens array deposited and formed in the shape of hemisphere during the chemical vapor deposition process according to placement of the mesa array.

11. The method of fabricating the light emitting pixel unit according to claim 1, wherein the shape of the micro-lens is hemisphere when the top of the mesa is flat.

12. The method of fabricating the light emitting pixel unit according to claim 1, wherein the at least one mesa includes at least a light emitting device.

13. The method of fabricating the light emitting pixel unit according to claim 1, wherein parameters of the chemical vapor deposition process used to deposit the micro-lens material layer and forming the shape of hemisphere on the at least one mesa include: power is less than 1000 W, pressure is between 100 milli-torr to 2000 milli-torr, temperature is between 23° C. to 500° C., gas flow rate is less than 3000 sccm, and time is between 1 hour to 3 hours.

14. The method of fabricating the light emitting pixel unit according to claim 1, further comprising: patterning the micro-lens material layer to expose an electrode area of the substrate.

15. The method of fabricating the light emitting pixel unit according to claim 14, wherein patterning further includes:
 forming a mask on surface of the micro-lens material;
 patterning the mask via a photolithography process, thereby forming openings in the mask and exposing the micro-lens material layer above the electrode area of the at least one mesa; and
 with the mask protection in place, etching portions of the micro-lens material layer exposed by the openings.

16. The method of fabricating the light emitting pixel unit according to claim 15, wherein etching is a wet etching method.

* * * * *